(12) United States Patent
Shin et al.

(10) Patent No.: US 10,942,410 B2
(45) Date of Patent: Mar. 9, 2021

(54) DISPLAY DEVICE AND MANUFACTURING METHOD THEREOF

(71) Applicant: SAMSUNG DISPLAY CO., LTD., Yongin-si (KR)

(72) Inventors: Donghee Shin, Yongin-si (KR); Yoomi Ra, Yongin-si (KR); Hyungjin Song, Yongin-si (KR); Soohong Cheon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/414,287

(22) Filed: May 16, 2019

(65) Prior Publication Data

US 2020/0073162 A1    Mar. 5, 2020

(30) Foreign Application Priority Data

Aug. 28, 2018  (KR) .......................... 10-2018-0101562

(51) Int. Cl.
*G02F 1/1368*     (2006.01)
*G02F 1/1362*     (2006.01)
(Continued)

(52) U.S. Cl.
CPC .......... *G02F 1/1368* (2013.01); *G02F 1/1339* (2013.01); *G02F 1/133504* (2013.01);
(Continued)

(58) Field of Classification Search
CPC ............. G02F 1/1368; G02F 1/136286; G02F 1/1339; G02F 1/133504; G02F 1/133617;
(Continued)

(56) References Cited

U.S. PATENT DOCUMENTS

| 9,874,794 | B2 | 1/2018 | Kim et al. |
| 2007/0126969 | A1* | 6/2007 | Kimura ............. G02F 1/133555 349/141 |
| 2017/0017022 | A1* | 1/2017 | Yonemoto .............. G02B 6/005 |

FOREIGN PATENT DOCUMENTS

| KR | 10-2004-0045201 A | 6/2004 |
| KR | 10-2006-0110196 A | 10/2006 |

(Continued)

*Primary Examiner* — Thien F Tran
(74) *Attorney, Agent, or Firm* — Kile Park Reed & Houtteman PLLC

(57) ABSTRACT

A display device includes a bottom substrate including a display area and a non-display area around the display area, a thin film transistor region in the display area, the thin film transistor region including a plurality of thin film transistors and a plurality of pixel electrodes each electrically connected to a respective one of the thin film transistors, a top substrate facing the bottom substrate with the thin film transistor region therebetween, a seal in the non-display area to surround the thin film transistor region, the seal being configured to bond the bottom substrate to the top substrate, a wiring group between the seal and the bottom substrate, the wiring group including a plurality of conductive lines spaced apart from each other by a predetermined interval, and a light-scattering layer between the seal and the top substrate, the light-scattering layer including light-scattering particles.

15 Claims, 7 Drawing Sheets

(51) Int. Cl.
  *G02F 1/1339* (2006.01)
  *G02F 1/1335* (2006.01)
  *G02F 1/13357* (2006.01)
  *H01L 27/12* (2006.01)
  *G02F 1/1333* (2006.01)

(52) U.S. Cl.
  CPC .. G02F 1/133617 (2013.01); G02F 1/136286 (2013.01); H01L 27/124 (2013.01); H01L 27/1248 (2013.01); H01L 27/1259 (2013.01); *G02F 2001/133357* (2013.01); *G02F 2001/136222* (2013.01); *G02F 2001/136295* (2013.01); *G02F 2201/121* (2013.01); *G02F 2201/123* (2013.01); *G02F 2202/36* (2013.01)

(58) Field of Classification Search
  CPC ..... G02F 2001/136295; G02F 2202/36; G02F 2001/133357; G02F 2201/121; G02F 2001/136222; G02F 2201/123; G02F 1/133512; G02F 1/133514; H01L 27/124; H01L 27/1259; H01L 27/1248
  See application file for complete search history.

(56) References Cited

FOREIGN PATENT DOCUMENTS

| | | |
|---|---|---|
| KR | 10-1209048 B1 | 11/2012 |
| KR | 10-2015-0066011 A | 6/2015 |
| KR | 10-2016-0072653 A | 6/2016 |

* cited by examiner

DISPLAY DEVICE AND MANUFACTURING METHOD THEREOF

CROSS-REFERENCE TO RELATED APPLICATION

Korean Patent Application No. 10-2018-0101562, filed on Aug. 28, 2018, in the Korean Intellectual Property Office, and entitled: "Display Device and Manufacturing Method Thereof," is incorporated by reference herein in its entirety.

BACKGROUND

1. Field

One or more embodiments relate to a display device and a manufacturing method thereof, and more particularly, to a display device with a reduced non-emission area, which displays a high-quality image and simultaneously has improved reliability, and a method of manufacturing the display device.

2. Description of the Related Art

As various kinds of electronic apparatuses such as mobile phones, computers, and large-scale TVs evolve, the demand for flat display devices is gradually increasing. Among the flat display devices, liquid crystal display (LCD) has advantages such as low power consumption, easy moving image displaying, and a high contrast ratio.

The LCD includes a liquid crystal layer arranged between two display substrates and applies an electric field to the liquid crystal layer to change an arrangement direction of liquid crystal molecules, thereby changing polarization of incident light, and makes the polarization cooperate with a polarizer to control whether to transmit the incident light for each pixel, thereby displaying an image.

SUMMARY

Embodiments are directed to a display device including a bottom substrate including a display area and a non-display area around the display area, a thin film transistor region in the display area, the thin film transistor region including a plurality of thin film transistors and a plurality of pixel electrodes each electrically connected to a respective one of the thin film transistors, a top substrate facing the bottom substrate with the thin film transistor region therebetween, a seal in the non-display area to surround the thin film transistor region, the seal being configured to bond the bottom substrate to the top substrate, a wiring group between the seal and the bottom substrate, the wiring group including a plurality of conductive lines spaced apart from each other by a predetermined interval, and a light-scattering layer between the seal and the top substrate, the light-scattering layer including light-scattering particles.

The light-scattering particles may include quantum dot particles.

A diameter of the light-scattering particles may be about 2 nm to about 30 nm.

The display device may further include a light-blocking layer under the top substrate, the light blocking layer including a plurality of openings respectively corresponding to the plurality of pixel electrodes, a filter including a plurality of color filters under the top substrate to cover the plurality of openings, a planarization layer covering the color filters and configured to planarize a top surface of the color filters, and a common electrode on the planarization layer. At least some of the plurality of color filters include the quantum dot particles.

The light-scattering layer may include a same material as one of the plurality of color filters.

The planarization layer may extend to the non-display area and may be between the seal and the light-scattering layer.

The light-blocking layer may extend to the non-display area and may be between the top substrate and the light-scattering layer.

The common electrode may extend to the non-display area and may be between the seal and the planarization layer.

Each of the thin film transistors may include a gate electrode and a semiconductor layer that at least partially overlaps the gate electrode. The wiring group may include a same material as the gate electrode.

The display device may further include a light-blocking layer arranged between the seal and the top substrate.

The thin film transistor region may further include a plurality of color filters between the thin film transistor and the plurality of pixel electrodes. The plurality of color filters may each correspond to a respective one of the plurality of pixel electrodes.

The wiring group may include a wiring configured to transfer a clock signal to the thin film transistors.

A width of each of the plurality of conductive lines may be about 50 μm to about 100 μm.

A spaced width between the plurality of conductive lines may be about 15 μm to about 20 μm.

The wiring group may overlap the seal.

Embodiments are also directed to a method of manufacturing a display device including preparing a bottom substrate and a top substrate each including a display area and a non-display area around the display area, forming a wiring group in the non-display area of the bottom substrate, the wiring group including a plurality of conductive lines having spaced widths separated from each other by a predetermined interval, forming a light-scattering layer in the non-display area of the top substrate, the light-scattering layer including light-scattering particles, forming a seal between the bottom substrate and the top substrate such that the seal overlaps the wiring group, and hardening the seal by irradiating light from the bottom substrate toward the top substrate.

During the hardening of the seal, at least a portion of the light irradiated onto the bottom substrate may pass through spaced widths between the plurality of conductive lines and is irradiated onto the light-scattering layer.

At least a portion of the light irradiated on the light-scattering layer may be reflected toward the seal.

The method may further include forming a light-blocking layer between the top substrate and the light-scattering layer in the non-display area of the top substrate. At least a portion of the light irradiated on the light-scattering layer may be reflected toward the seal by the light-blocking layer.

The light-scattering particles may include quantum dot particles each having a diameter ranging from about 2 nm to about 30 nm.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
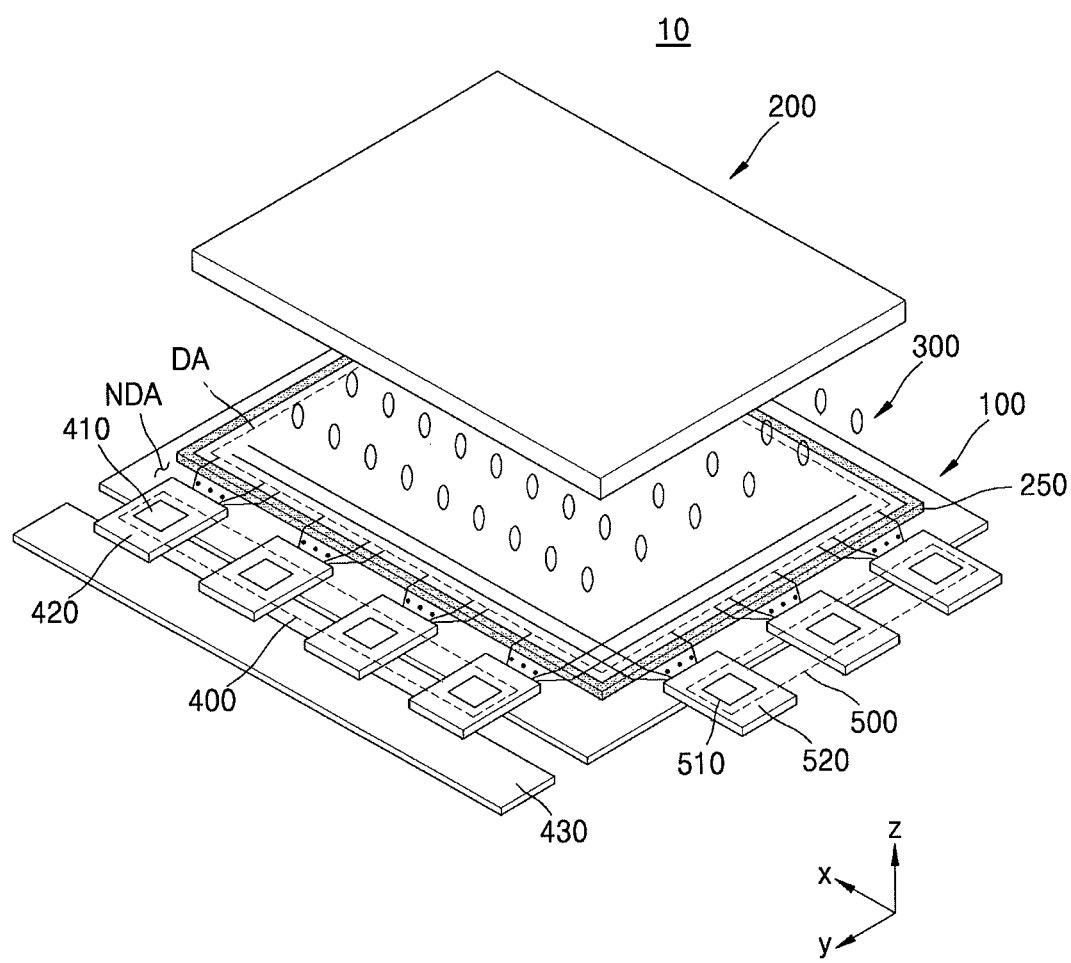
FIG. 1 illustrates an exploded perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout. It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

As used herein, the term "and/or" includes any and all combinations of one or more of the associated listed items.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

General and specific embodiments may be implemented by using a system, a method, a computer program, or a combination thereof.

A display device is a device that displays an image and may include liquid crystal displays, electrophoretic displays, organic light-emitting displays, inorganic light-emitting displays, field emission displays, surface-conduction electron-emitter displays, plasma displays, cathode ray displays, etc.

Hereinafter, though a liquid crystal display device is exemplarily described as a display device according to an embodiment, the display device according to the present disclosure is not limited thereto and may include various display devices.

Figure 2:
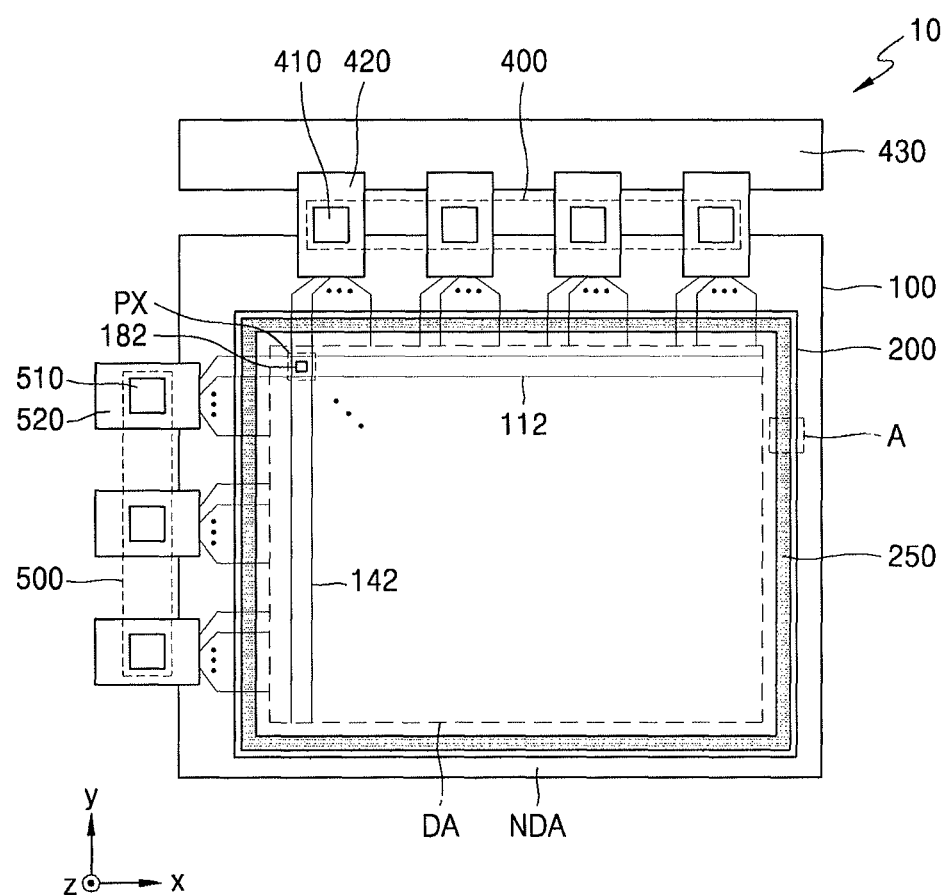
FIG. 2 illustrates a plan view of the display device of FIG. 1.

FIG. 1 illustrates an exploded perspective view of a display device 10 according to an embodiment, and FIG. 2 illustrates a plan view of the display device 10 of FIG. 1.

Referring to FIGS. 1 and 2, the display device 10 may include a bottom substrate 100, a top substrate 200 facing the bottom substrate 100, a liquid crystal layer 300 arranged between the bottom substrate 100 and the top substrate 200, and a seal 250 configured to bond the bottom substrate 100 on the top substrate 200.

The bottom substrate 100 of the display device 10 may include a display area DA and a non-display area NDA surrounding the display area DA. A plurality of pixels that are arranged in a matrix may be arranged in the display area DA.

Referring to FIG. 2, a pixel electrode 182 may be arranged in each of pixels PX in the display area DA of the bottom substrate 100. The pixel electrode 182 may receive a data voltage through a thin film transistor TFT (see FIG. 5) arranged over the bottom substrate 100. A common electrode 630 (see FIG. 5) provided as one body regardless of the pixels PX may be arranged over the entire surface of the display area DA of the top substrate 200. The pixel electrode 182 may generate an electric field in cooperation with the common electrode 630 (see FIG. 5) and may control an alignment direction of liquid crystal molecules contained in the liquid crystal layer 300 arranged between the pixel electrode 182 and the common electrode 630.

A data driver 400 configured to provide a data driving signal and a gate driver 500 configured to provide a gate driving signal may be arranged outside the display area DA of the bottom substrate 100.

The data driver 400 may receive image signals and a data control signal from a timing controller. The data driver 400 may generate analog data voltages corresponding to image signals in response to a data control signal. The data driver 400 may provide a data voltage to each pixel through a data line 142.

The data driver 400 may include a plurality of data driving chips 410. The data driving chips 410 may be mounted on a corresponding first flexible circuit board 420 and may be connected to a driving circuit board 430 and a data pad of the non-display area NDA. The first flexible circuit board 420 on which the data driving chip 410 is mounted may be connected to corresponding data pads by anisotropic conductive films (see FIG. 6).

The gate driver 500 may generate gate signals in response to a gate control signal provided from the timing controller mounted on the driving circuit board 430. Gate signals may be provided to pixels sequentially on a row basis through a gate line 112. A gate control signal may be provided to the gate driver 500 through a second flexible circuit board 520.

The gate driver 500 may include a plurality of gate driving chips 510. The gate driving chip 510 may be mounted on a corresponding second flexible circuit board 520 and connected to a gate pad of the non-display area NDA. The second flexible circuit board 520, on which the gate driving chip 510 is mounted, may be connected to a corresponding gate pad by an anisotropic conductive film.

In the present embodiment, a tape carrier package (TCP) in which the data driving chip 410 and the gate driving chip 510 are respectively mounted on the first and second flexible circuit boards 420 and 520 is described as an example. In some implementations, the data driving chip 410 and the gate driving chip 510 may be mounted in the non-display area NDA by using a chip-on-glass (COG) technique. In some implementations, the gate driver 500 may be provided by using an amorphous silicon gate (ASG) formed as one body in the non-display area NDA.

The bottom substrate 100 may be bonded onto the top substrate 200 by using the seal 250 including a sealant. The seal 250 may be arranged in the non-display area NDA of the bottom substrate 100 and the top substrate 200. The seal 250 may be formed by coating a sealant, etc., on the non-display area NDA of the bottom substrate 100 or the top substrate 200 and irradiating light onto the sealant to harden the sealant.

The seal 250 may be implemented in various suitable shapes depending on a structure of the display 10. For example, in an embodiment, the seal 250 may be arranged in the non-display area NDA to surround the display area DA. For example, as shown in FIG. 2, the seal 250 may be implemented in a quadrangular band shape of a closed curve surrounding the display 10.

A common voltage supply wiring may be located in the non-display area NDA.

The liquid crystal layer 300 including liquid crystal molecules having positive dielectric constant anisotropy or a negative dielectric constant anisotropy may be arranged between the bottom substrate 100 and the top substrate 200.

A narrow bezel liquid crystal display device in which a width of a non-display area NDA is narrow may have a narrow non-display area NDA compared to a non-narrow bezel liquid crystal display device. In the display device according to the present embodiment, the seal 250 may overlap a wiring group 260 (see FIG. 3) arranged in the non-display area NDA.

Figure 3:
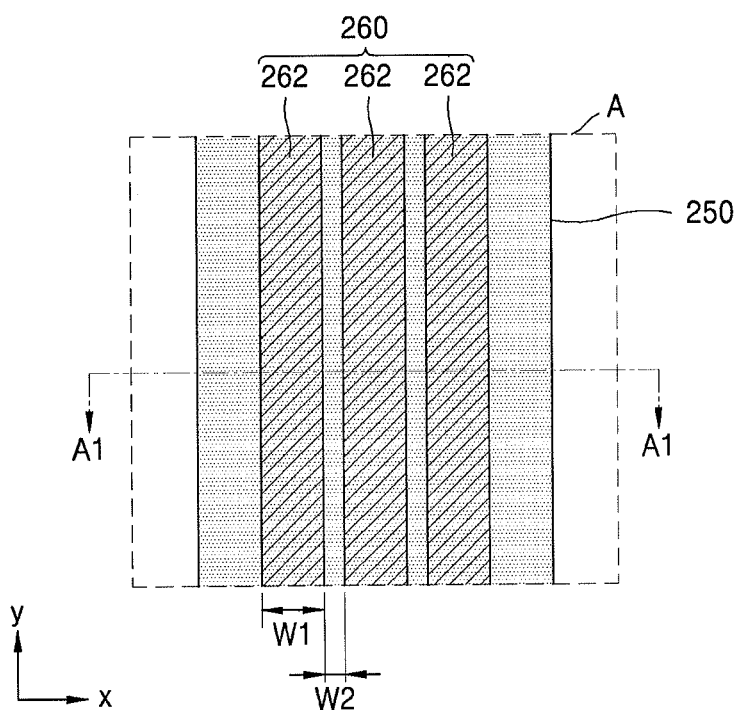
FIG. 3 illustrates an enlarged view of portion A of FIG. 2.
Figure 4:
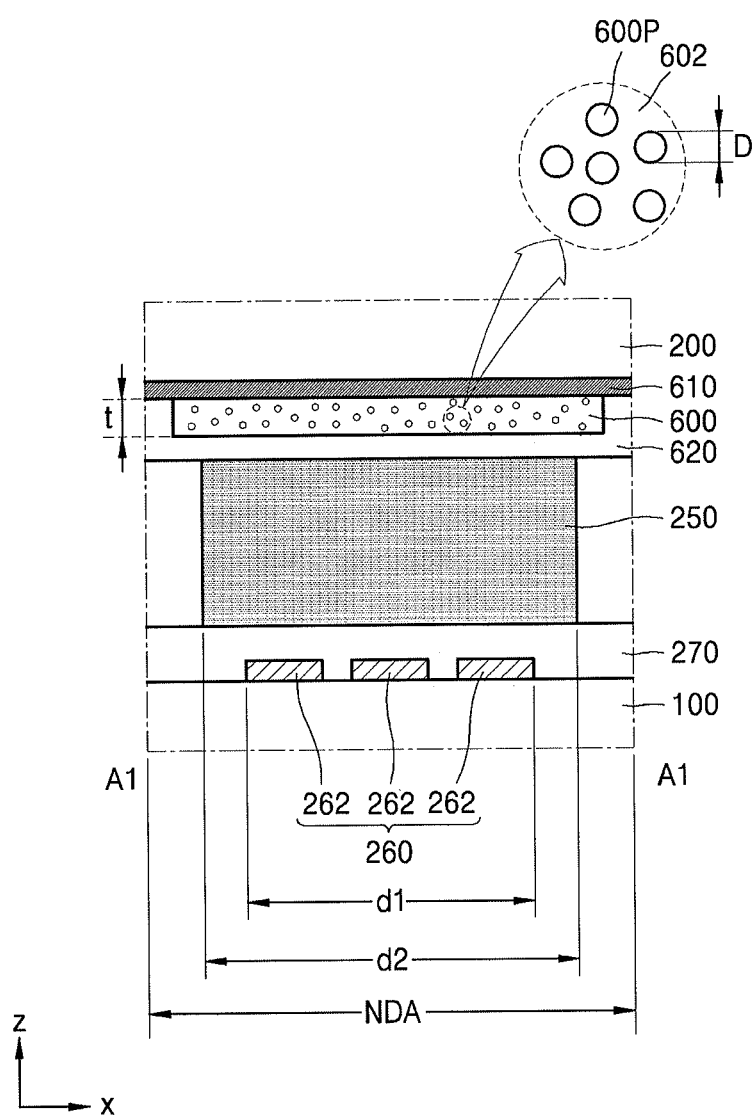
FIG. 4 illustrates a cross-sectional view of the display device taken along line A1-A1 of FIG. 3.

FIG. 3 illustrates an enlarged view of portion A of FIG. 2, and FIG. 4 illustrates a cross-sectional view of the display device taken along line A1-A1 of FIG. 3.

Referring to FIGS. 3 and 4, the wiring group 260 may be arranged in the non-display area NDA of the bottom substrate 100. The wiring group 260 may include a plurality of conductive lines that extend in a first direction (y-direction). Each conductive line 262 may be arranged between the bottom substrate 100 and the seal 250. An insulating layer 270 may be arranged on the wiring group 260, and the seal 250 may be arranged on the insulating layer 270.

The wiring group 260 may include wirings configured to transfer a signal to each pixel PX (see FIG. 2) of the display 10 (see FIG. 2). For example, the wiring group 260 may include wirings configured to transfer a clock signal.

In FIG. 4, the insulating layer 270 is shown as a single layer. In some implementations, the insulating layer 270 may have a multi-layered structure in which a plurality of layers are stacked. The insulating layer 270 may include an organic layer or an inorganic layer, or an organic/inorganic composite layer. In an embodiment, the insulating layer 270 may include silicon oxide and/or silicon nitride.

The wiring group 260 may overlap the seal 250. As shown in FIG. 4, a width d1 of the wiring group 260 in a second direction (x-direction) may be less than a width d2 of the seal 250, and the seal 250 may entirely overlap entire wiring group 260.

As described above, when the seal 250 overlaps the wiring group 260, a portion of light irradiated for hardening the seal 250 may be blocked by the wiring group 260. As a result, a portion of the seal 250 may not be hardened and a sealing defect could occur. As a comparative example to address this issue, an opening rate of the wiring group 260 itself may be improved by narrowing the width of the conductive line 262 to be about 10 μm to about 35 μm. However, in this case, a resistance may be increased by the narrowed width, a load applied to the wiring group 260 may increase. For example, in a large-scale display device, it is desirable to decrease a resistance of the wiring group 260 so as to secure a charging rate of a pixel.

The display device according to an embodiment may implement a narrow-bezel display device by allowing the seal 250 to overlap the wiring group 260. A non-hardening issue of the seal 250 caused by light-shielding of the wiring group 260 may be addressed by including a light-scattering layer 600 between the seal 250 and the top substrate 200.

The light-scattering layer 600 may be arranged between the top substrate 200 and the seal 250. A planarization layer 620 may cover the light-scattering layer 600. The planarization layer 620 may be arranged between the seal 250 and the light-scattering layer 600. The planarization layer 620 may include, for example, an organic insulating layer. In another embodiment, the planarization layer 620 may be omitted.

The light-scattering layer 600 may include light-scattering particles 600P. When light irradiated onto the seal 250 for hardening may be reflected back toward the seal 250 by the light-scattering particles 600P contained in the light-scattering layer 600. Accordingly, light efficiency may be improved and thus, the seal 250 may be effectively hardened with only minimum amount of light. In an embodiment, a diameter of the light-scattering particles 600P may be about 2 nm to about 30 nm.

The light-scattering layer 600 may have a thickness T ranging from about 1 μm to about 10 μm. For example, the light-scattering layer 600 have a thickness T ranging from about 6 μm to about 7 μm. When the thickness T of the light-scattering layer 600 is 1 inn or more, light scattering may be properly performed, and a light efficiency-enhancing effect may be sufficient. When the thickness T of the light-scattering layer 600 is 10 μm or less, absorption of light in the light-scattering layer 600 may be reduced and light reflection may be performed by a light-blocking layer 610, which is described below. Light efficiency may be provided.

In the present embodiment, the light-scattering particles 600P may be quantum dot particles. In some implementations, a quantum rod or tetrapod quantum dots may be used for the light-scattering particles 600P.

The quantum dot particle may absorb incident light and then emit light having a wavelength different from that of the incident light. For example, the quantum dot particle may have a wavelength-converting particle that may convert a wavelength of light incident to the quantum dot particle. A wavelength of light converted by the quantum dot particle may vary depending on the size of the quantum dot particle.

For example, the quantum dot particle may be adjusted to emit light of a desired color by adjusting a diameter of the quantum dot particle.

For example, when a diameter D of the quantum dot particle is about 2 nm to about 3 nm, the quantum dot particle may emit light having a blue wavelength. When a diameter D of the quantum dot particle is about 3 nm to about 5 nm, the quantum dot particle may emit light having a green wavelength. When a diameter D of the quantum dot particle is about 5 nm to about 30 nm, the quantum dot particle may emit light having a red wavelength.

A quantum dot particle generally has a high extinction coefficient and a high quantum yield and generates very strong fluorescent light. For example, a quantum dot particle may absorb light having a short wavelength and emit light having a longer wavelength.

In an embodiment, a quantum dot particle may have a structure including a core and a shell surrounding the core. The shell may include two or more layers. A quantum dot particle may include an organic ligand coupled to a shell and may include an organic coating layer surrounding the shell.

A quantum dot particle may include at least one of a group II compound semiconductor, a group III compound semiconductor, a group V compound semiconductor, and a group VI compound semiconductor. For example, a core constituting a quantum dot particle may include at least one of PbSe, InAs, PbS, CdSe, InGaP, CdTe, CdS, ZnSe, ZnTe, ZnS, HgTe and HgS. The shell may include at least one of CuZnS, CdSe, CdTe, CdS, ZnSe, ZnTe, ZnS, HgTe and HgS.

Even a quantum dot particle including the same material may emit different light depending on its diameter.

In another embodiment, the light-scattering particle 600P may be a scatterer particle. The light-scattering particles 600P may be distributed inside an insulating material 602. The insulating material 602 may include, for example, a resin composition including an organic material, an inorganic material, or an organic/inorganic composite body. The insulating material 602 may include, for example, a transparent organic layer including an acrylic-based resin, or an inorganic layer including SiOx or SiNx, or an organic/inorganic compound such as polysilsesquioxane. For example, when the insulating material 602 includes an organic layer, the insulating material 602 may include a transparent organic material such as a light-hardened polymer or a thermosetting polymer.

Various materials that provide a light-scattering effect may be used. For example, to improve a scattering effect, the scatterer particle may include a material having a refractive index of 2 or more. For example, for the scatterer particle, $TiO_2$ having a refractive index of 2.66 may be used. For example, an inorganic particle such as $SiO_2$ and $ZrO_2$ or a polymer material such as polystyrene (PS) or polymethylmethacrylate (PMMA) may be used.

Referring to FIG. 4, the light-blocking layer 610 may be located between the light-scattering layer 600 and the top substrate 200. The light-blocking layer 610 may also be located in the display area DA. For example, a portion of the light-blocking layer 610 that is located in the display area DA may serve as a black matrix BM which blocks light between pixels except an emission area of each pixel. The light-blocking layer 610 and may be arranged in the non-display area NDA as shown in FIG. 4 by extending a portion of the light-blocking layer from the display area DA to the non-display area NDA.

In the present embodiment, a portion of the light-blocking layer 610 that is located in the non-display area NDA may serve as a reflection plate of light. A portion of irradiated light for hardening the seal 250 that reaches the light-blocking layer 610 may be reflected by a surface of the light-blocking layer 610 and maybe incident back to the light-scattering layer 600. Accordingly, light efficiency of the light-scattering layer 600 may be secondarily enhanced through the reflected light.

In the present embodiment, the light-blocking layer 610 may include a black organic polymer material including black dye or pigment that may block light, or metal (metal oxide) such as chromium and chromium oxide. When the light-blocking layer 610 includes metal, the light-blocking layer 610 may serve as a reflection plate of light.

Referring again to FIG. 3, in the present embodiment, the wiring group 260 may include the plurality of conductive lines 262. Each of the plurality of conductive lines 262 may have a width W1 in the second direction (x-direction). In the present embodiment, the width W1 of each of the conductive lines 262 may be about 50 μm to about 200 μm, or, for example, about 100 μm. The plurality of conductive lines 262 may be spaced apart from each other with a predetermined interval. A spaced width W2 between the plurality of conductive lines 262 may be about 15 μM to about 20 μm.

As a comparative example, in the case of improving an aperture ratio that may transmit light by forming a slit in each of the plurality of conductive lines, a width of each of the conductive lines is reduced to 30 μm or less, which increases a resistance of the wiring group 260.

The display device according to an embodiment may reduce a resistance of the wiring group 260 by forming the width W1 of each of the plurality of conductive lines 262 to be in the range of about 50 μm to about 200 μm.

Light for hardening the seal 250 may be incident on the seal 250 through the spaced width W2 between the plurality of conductive lines 262. As described above, when a width of each of the conductive lines 262 has been formed to be about 100 μm so as to reduce a resistance of the wiring group 260, an amount of light incident on the seal 250 becomes less than the case where a slit is formed in each of the conductive lines in the comparative example. However, according to the present embodiment, a portion of light incident on the seal 250 may be incident on the light-scattering layer 600, and as a result, the seal 250 may be effectively hardened by maximally improving light efficiency with only a small amount of light based on emission from the light-scattering layer 600 on which the light has been incident.

Figure 5:
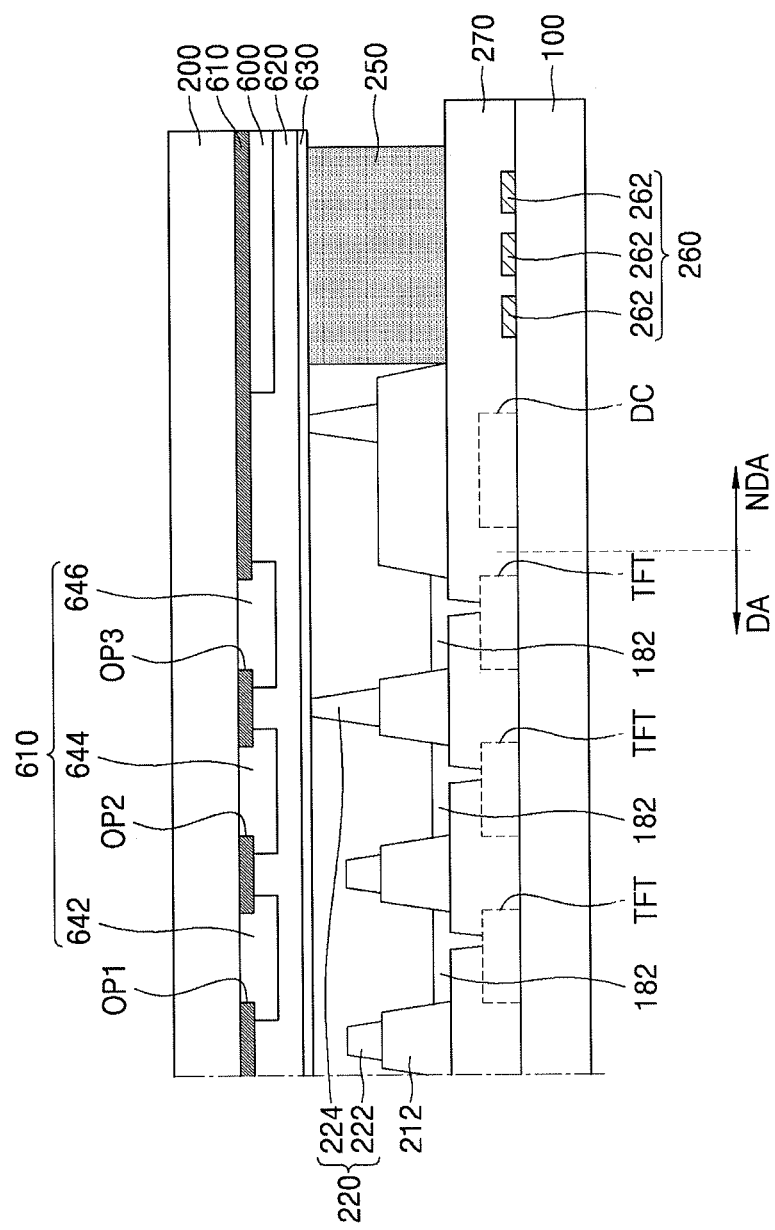
FIG. 5 illustrates a cross-sectional view of a display device according to another embodiment.

FIG. 5 illustrates a cross-sectional view of a display device according to another embodiment.

FIG. 5 shows a portion of the display area DA and a portion of the non-display area NDA in the display device.

Referring to FIG. 5, the non-display area in which the seal 250 m arranged may be the same as that of the embodiments of FIGS. 3 and 4. In an embodiment, a common electrode 630 may extend between the seal 250 and the planarization layer 620 as shown in FIG. 5.

The display area DA is an area that displays an image. The thin film transistor region is arranged in the display area DA, the thin film transistor region including a plurality of pixel electrodes 182 each electrically connected to respective one of thin film transistors TFT. The thin film transistor region may be within the display 10 (see FIG. 2). A specific configuration of the thin film transistor TFT is the same as that shown in FIG. 7. Accordingly, description thereof is made with reference to FIG. 7.

A column spacer 220 may be arranged between the pixel electrodes 182. The column spacer 220 may include a sub column spacer 222 and a main column spacer 224. An upper portion of the main column spacer 224 may contact layers of the top substrate 200. The bottom substrate 100 may be spaced apart from the top substrate 200 by a predetermined distance.

The sub column spacer 222 may have a lower step difference than the main column spacer 224. In this case, an interval between the bottom substrate 100 and the top substrate 200 may be maintained against external pressure primarily by the main column spacer 224. In the case where even more pressure is applied, an interval between the bottom substrate 100 and the top substrate 200 may be secondarily maintained by the sub column spacer 222.

The light-blocking layer 610 including a plurality of openings OP1, OP2, and OP3 respectively corresponding to the plurality of pixels may be arranged under the top substrate 200. The light-blocking layer 610 is the same as that of the previous embodiment of FIG. 4. A filter 640 may be located in the plurality of openings OP1, OP2, and OP3 of the light-blocking layer 610. The filter 640 may include a plurality of color filters 642, 644, and 646. The color filters 642, 644, and 646 may respectively cover the openings OP1, OP2, and OP3. Light emitted from a backlight unit may be emitted in different wavelengths through the color filters 642, 644, and 646.

In the present embodiment, each of the color filters 642, 644, and 646 of the filter 640 is described as including quantum dot particles. In some implementations, each of the color filters 642, 644, and 646 of the filter 640 may include a quantum rod or tetrapod quantum dots.

A quantum dot particle absorbs incident light and then emits light having a wavelength different from that of the incident light. For example, the quantum dot particle may be a wavelength-converting particle that converts a wavelength of light incident to the quantum dot particle. A wavelength of light converted by the quantum dot particle may vary depending on a size of the quantum dot particle. For example, the quantum dot particle may be adjusted to emit light of a desired color by adjusting a diameter of the quantum dot particle.

The color filters 642, 644, and 646 may respectively include quantum dot particles having different sizes. For example, when a diameter D of a quantum dot particle is about 2 nm to 3 nm, the quantum dot particle may emit light having a blue wavelength. When a diameter D of the quantum dot particle is about 3 nm to about 5 nm, the quantum dot particle may emit light having a green wavelength. When a diameter D of the quantum dot particle is about 5 nm to about 30 nm, the quantum dot particle may emit light having a red wavelength.

At least one of the openings OP1, OP2, and OP3 may be covered by an insulating layer that does not include quantum dot particles. The wavelength of light that passes through the insulating layer that does not include quantum dot particles may not be changed. For example, in the case where the backlight unit emits blue light, a color filter that emits light having a blue wavelength may not be required. Therefore, at least one of the openings OP1, OP2, and OP3 may be covered by an insulating layer that does not include quantum dot particles and blue light from the backlight unit may be allowed to pass without change.

In the present embodiment, the light-scattering layer 600 arranged over the seal 250 may include the same material as one of the color filters 642, 644, and 646. As described above, the color filters 642, 644, and 646 include quantum dot particles and emit light having different wavelengths depending on sizes of the quantum dot particles. Therefore, the light-scattering layer 600 may include quantum dot particles that emit red light, or quantum dot particles that emit blue light, or quantum dot particles that emit green light.

In the present embodiment, the wiring group 260 may include the same material as a gate electrode 114 (see FIG. 7) of the thin film transistor TFT. In some implementations, the wiring group 260 may include the same material as a source electrode 144 and a drain electrode 146 of the thin film transistor TFT.

Figure 6:
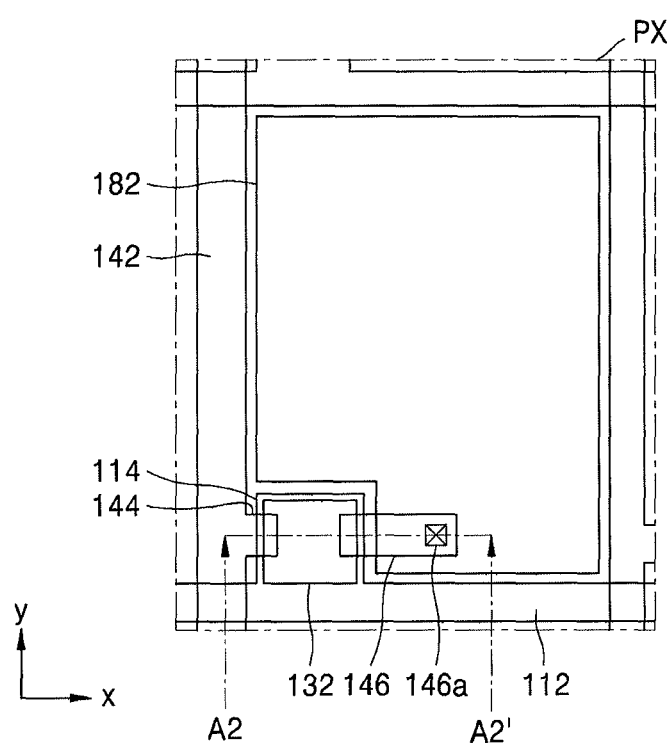
FIG. 6 illustrates an enlarged view of a pixel PX of the display device of FIG. 2.
Figure 7:
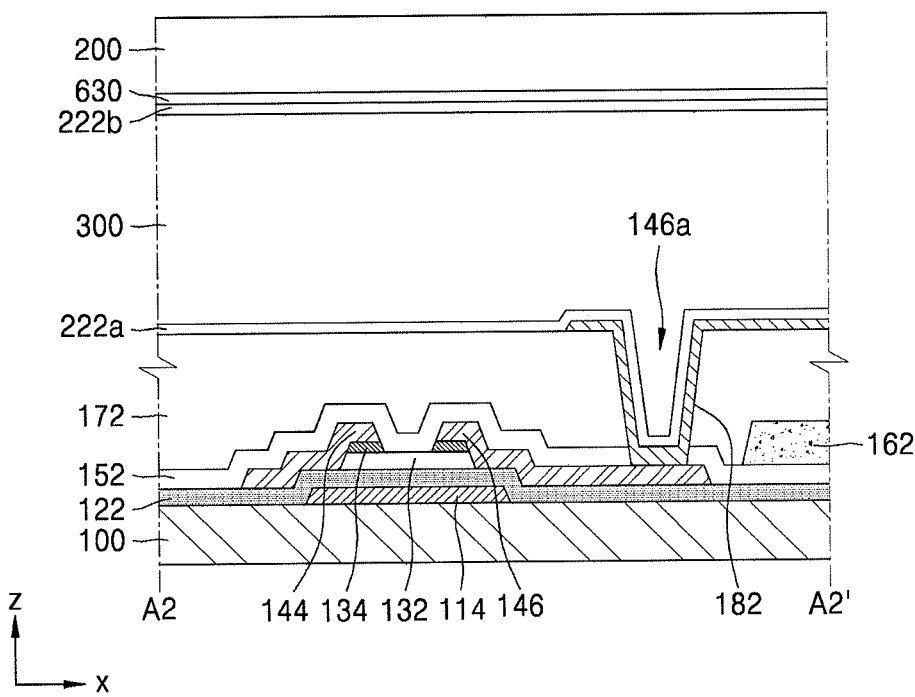
FIG. 7 illustrates a cross-sectional view of the display device taken along line A2-A2' of FIG. 6.

FIG. 6 illustrates an enlarged view of a pixel PX of the display device of FIG. 2. FIG. 7 illustrates a cross-sectional view of the display device taken along line A2-A2' of FIG. 6.

Referring to FIGS. 6 and 7, a structure of the display device 10 (see FIG. 2) including a pixel PX (see FIG. 2) of the display device 10 according to an embodiment is described hereinafter as an example.

The bottom substrate 100 may include an insulating material such as transparent glass, quartz, ceramic, silicon or plastic. In an embodiment, the bottom substrate 100 may have flexibility. For example, the bottom substrate 100 may be a substrate whose shape may be transformed by using rolling, folding, bending, etc.

Gate wirings 112 and 114 and data wirings 142, 144 and 146 may be arranged over the bottom substrate 100.

The gate wirings 112 and 114 may include the gate line 112 and the gate electrode 114. The data wirings 142, 144, and 146 may include the data line 142, the source electrode 144 and the drain electrode 146.

The gate wirings 112 and 114 and the data wirings 142, 144 and 146 may include various metals and various conductors. The gate wirings 112 and 114 and the data wirings 142, 144 and 146 may include one of an aluminum-based metal such as Al or an aluminum alloy, a silver-based metal such as Ag or a silver alloy, a copper-based metal such as Cu or a copper alloy, a molybdenum-based metal such as Mo or a molybdenum alloy, Cr, Ti, or Ta.

The gate wirings 112 and 114 and the data wirings 142, 144 and 146 may have a multi-layered structure including two conductive layers having different physical properties. For example, one of the conductive layers may include one of an aluminum-based metal, a silver-based metal, and a copper-based metal, and the other may include one of a molybdenum-based metal, Cr, Ti, and Ta. Examples of these combinations may include a combination of a chromium bottom layer and an aluminum top layer, and a combination of an aluminum bottom layer and a molybdenum top layer.

The gate line 112 may extend in the second direction (x-direction), for example, a horizontal direction along a boundary of pixels, and the data line 142 may extend in the first direction (y-direction), for example, along a vertical boundary of pixels. The gate line 112 and the data line 142 may be arranged to cross each other and define a pixel area. For example, the pixel area may be defined by an area surrounded by the gate line 112 and the data line 142.

In every pixel, at least one gate electrode 114 may be connected to the gate line 112. The gate electrode 114 may branch off from the gate line 112 toward the semiconductor layer 132 or the gate line 112 may extend to form the gate electrode 114. The gate electrode 114 may be defined in an area that overlaps the semiconductor layer 132 on an extended path of the gate line 112.

In every pixel, at least one source electrode 144 is connected to the data line 142. The source electrode 144 may branch off from the data line 142 toward the semiconductor layer 132 or the data line 142 may extend to form the source electrode 144. The source electrode 144 may be defined in an area that overlaps the semiconductor layer 132 on an extended path of the data line 142. For example, the source electrode 144 may not protrude from the data line 142 and may be located on the same line as the data line 142. The drain electrode 146 may be spaced apart from the source electrode 144 around the semiconductor layer 132 and may be electrically connected to the pixel electrode 182 through a contact hole 146*a* that passes through a passivation layer 152 and an organic layer 172 which will be described below.

A gate insulating layer 122 may be arranged between the gate wiring 112 and 114 and the data wirings 142, 144, and 146. In an embodiment, the gate insulating layer 122 may be arranged on the gate wirings 112 and 114, and the data wirings 142, 144, and 146 may be arranged over the gate insulating layer 122. The gate insulating layer 122 may include, for example, SiNx, SiO$_2$, SiON, or a stacked layer thereof. The gate insulating layer 122 may maintain insulation between conductive thin layers including the gate wirings 112 and 114 and the data line 142 located over the gate wirings 112 and 114.

The semiconductor layer 132 may be arranged on the gate insulating layer 122 and may include hydrogenated amorphous silicon or polycrystalline silicon. The semiconductor layer 132 may at least partially overlap the gate electrode 114. The semiconductor layer 132 may constitute a thin film transistor together with the gate electrode 114, the source electrode 144, and the drain electrode 146.

The semiconductor layer 132 may have a suitable shape such as an island shape or a linear shape. When the semiconductor layer 132 has been formed in a linear shape, the semiconductor layer 132 may overlap the data wirings 142, 144, and 146.

A resistive contact layer 134 may be arranged on the semiconductor layer 132. The resistive contact layer 134 may include n+ hydrogenated amorphous silicon highly doped with n-type impurities. The resistive contact layer 134 may be located between the semiconductor layer 132 thereunder and the source electrode 144 and the drain electrode 146 thereon and may reduce a contact resistance.

Similar to the semiconductor layer 132, the resistive contact layer 134 may have a suitable shape such as an island shape or a linear shape. When the semiconductor layer 132 has an island shape, the resistive contact layer 134 may also have an island shape. When the semiconductor layer 132 has a linear shape, the resistive contact layer 134 may also have a linear shape. Unlike the semiconductor layer 132, spaces of the resistive contact layer 134 in which the source electrode 144 is spaced apart from the drain electrode 146 with the source electrode 144 facing the drain electrode 146 may be separated from each other and a portion of the semiconductor layer 132 under the resistive contact layer 134 may be exposed. A channel may be formed in an area of the semiconductor layer 132 in which the source electrode 144 is spaced apart from the drain electrode 146 with the source electrode 144 facing the drain electrode 146.

When the gate electrode 114 receives a gate-on-signal and a channel is formed in the semiconductor layer 132, the thin film transistor may be turned on and the drain electrode 146 may receive a data signal from the source electrode 144 and transfer the data signal to the pixel electrode 182.

The passivation layer 152 may be arranged on the data wirings 142, 144, and 146 and the exposed portion of the semiconductor layer 132. A contact hole 146*a* that exposes at least a portion of the drain electrode 146 may be formed in the passivation layer 152 and the organic layer 172 which will be described below. The portion of the drain electrode 146 that is exposed through the contact hole 146*a* may contact the pixel electrode 182. Through this structure, the drain electrode 146 may be electrically connected to the pixel electrode 182.

The passivation layer 152 may include, for example, an inorganic material such as silicon nitride or silicon oxide, or a material such as a-Si:C:O and a-Si:O:F formed by plasma enhanced chemical vapor deposition (PECVD).

The organic layer 172 may be arranged on the passivation layer 152. The organic layer 172 may include a material having an excellent planarization characteristic and photosensitivity. The organic layer 172 includes the contact hole 146*a* that exposes the at least portion of the drain electrode 136.

In the present embodiment, as shown in FIG. 7, a color filter 162 may be arranged between the organic layer 172 and the passivation layer 152. The color filter 162 may include a red color filter R, a green color filter G, and a blue color filter B. Each of the color filters, that is, the red color filter R, the green color filter G, and the blue color filter B is formed in one pixel and constitutes one of pixels R, G, and B. The color filter 162 may overlap the pixel electrode 182.

In an embodiment, when the backlight unit emits blue light, the blue color filter B may be omitted.

The color filter 162 may include photosensitive organic material including pigment. The organic layer 172 may be arranged on the color filter 162 and may planarize step differences of the red color filter R, the green color filter G, and the blue color filter B. The color filter 162 may be covered by the organic layer 172. For example, the color filter 162 may have no exposed portion by being covered by the organic layer 172.

The pixel electrode 182 may be arranged on the organic layer 172 of every unit pixel. A portion of the pixel electrode 182 may be arranged inside the contact hole 146*a*. A portion of the pixel electrode 182 arranged inside the contact hole 146*a* to contact the drain electrode 146 and thus may be electrically connected to the drain electrode 146.

When a data voltage is applied to the pixel electrode 182 through the contact hole 146*a*, the pixel electrode 182 may generate an electric field in cooperation with the common electrode 630 and rotate liquid crystal molecules contained in the liquid crystal layer 300. The pixel electrode 182 may include, for example, a transparent conductive material such as indium tin oxide (ITO) or indium zinc oxide (IZO).

The top substrate 200 may include an insulating substrate. For example, like the bottom substrate 100, the top substrate 200 may include an insulating material such as transparent glass, quartz, ceramic, silicon or transparent plastic and may be appropriately selected as desired. In an embodiment, the top substrate 200 may have flexibility. For example, the top substrate 200 may include a substrate whose shape may be transformed by using rolling, folding, bending, etc. The top substrate 200 may face the bottom substrate 100.

The common electrode 630 may be arranged under the top substrate 200. The common electrode may receive a common voltage and generate an electric field in cooperation with the pixel electrode 182 to control an alignment direction of liquid crystal molecules contained in the liquid crystal layer 300.

The common electrode 630 may be formed as one body over all of the pixel area surrounded by the gate line 112 and the data line 142. The common electrode 630 may include, for example, a transparent conductive material such as ITO or IZO.

In an embodiment, a first alignment layer 222*a* and a second alignment layer 222*b* may be respectively arranged over one surface of the bottom substrate 100 and one surface of the top substrate 200 each facing the liquid crystal layer 300. The first alignment layer 222a may be arranged on the pixel electrode 182, and the second alignment layer 222b may be arranged under the common electrode 630. The first and second alignment layers 222a and 222b may align the liquid crystal layer 300. The first and second alignment layers 222a and 222b may include a resin-based polymer such as polyimide, polyamic acid, polyamide, polyamide-imide, polyester, polyethylene, polyurethane, or polystyrene, or a compound thereof. The first and second alignment layers 222a and 222b may include a monomer of the resin-based polymer.

Figure 8:
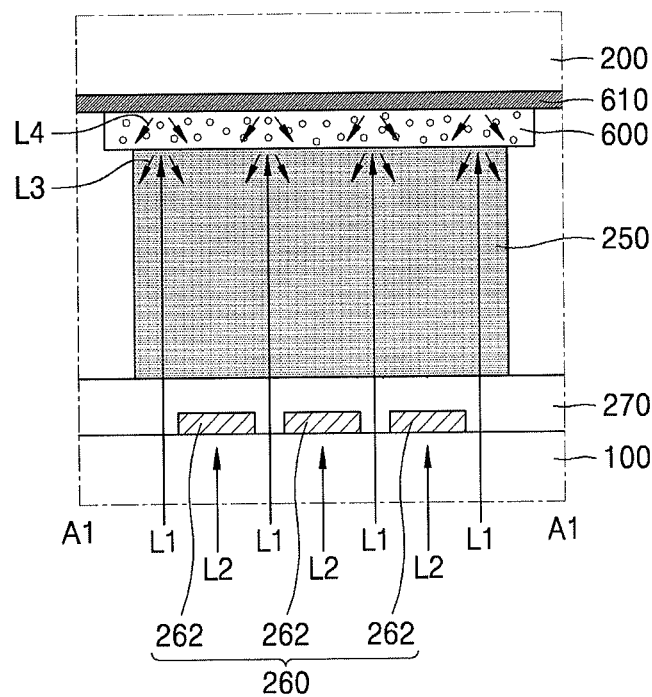
FIG. 8 illustrates a cross-sectional view of a portion of a process of manufacturing a display device according to another embodiment.

FIG. 8 illustrates a cross-sectional view of a stage of a process of manufacturing a display device according to another embodiment.

A method of manufacturing a display device according to an embodiment is described below with reference to FIG. 8 and FIGS. 1 to 7. Elements described below are the same as those of the previous embodiments, and like reference numerals denote like elements. Hereinafter, the manufacturing method is mainly described and repeated descriptions will not be repeated.

First, the bottom substrate 100 and the top substrate 200 each including the display area DA and the non-display area NDA around the display area DA may be prepared. The display 10 may be formed in the display area DA of the bottom substrate 100. When the display 10 has the same structure as that of FIGS. 1, 2, 5, and 7, the repeated description thereof will not be repeated.

The wiring group 260 that extends in the first direction (y-direction) may be formed in the non-display area NDA) of the bottom substrate 100. The wiring group 260 may include the plurality of conductive lines 262 that are spaced apart from each other with the predetermined width W2 (see FIG. 3). The wiring group 260 may be formed during the same process as a process of forming the gate electrode 114 of the thin film transistor TFT while the display 10 is formed.

The light-blocking layer 610 and a filter 640 may be sequentially formed in the display area DA of the top substrate 200. Since the detailed configurations of the light-blocking layer 610 and the filter 640 are the same as those of FIGS. 4 and 5, descriptions thereof will not be repeated.

During this process, the light-scattering layer 600 may be formed in the non-display area NDA of the top substrate 200. The light-scattering layer 600 may include light-scattering particles. In an embodiment, the light-scattering layer 600 may include the same material as that of the filter 640.

After forming the light-scattering layer 600, the seal 250 may be formed between the bottom substrate 100 and the top substrate 200 to overlap the wiring group 260. The seal 250 may be formed over the bottom substrate 100 or formed over the top substrate 200. The seal 250 may include a sealant that is hardened through light-hardening. As shown in FIG. 8, a process of forming the seal 250 between the bottom substrate 100 and the top substrate 200, and then hardening the seal 250 by irradiating light thereon may be performed.

The embodiment illustrated in FIG. 8 shows a structure in which the planarization layer 620 is not provided. The light-scattering layer 600 of FIG. 8 may include, for example, a scatterer including $TiO_2$ as a light-scattering particle.

Referring to FIG. 8, in the present embodiment, the seal 250 may be hardened by irradiating light L1 and L2 from the bottom substrate 100 toward the top substrate 200. A portion (light L2) of the light L1 and L2 irradiated toward the seal 250 may be blocked by the wiring group 260, and only a portion (light L1) may reach the seal 250 and harden the seal 250. In an embodiment, though a display device having a narrow bezel may be implemented by allowing the seal 250 to overlap the wiring group 260, as described above, a portion of the light is blocked by the wiring group 260 during a process of hardening the seal 250.

To allow the seal to be properly hardened, the display device according to an embodiment may improve light efficiency of incident light maximally by including the light-scattering layer 600 between the seal 250 and the top substrate 200 and scattering and reflecting the light L1 incident on the seal 250.

The light L1 incident on the seal 250 may reach the light-scattering layer 600 and scatter from the light-scattering particles or may be converted to light (light L3) having a wavelength different from that of the incident light L1. A portion of the light L1 that has reached the light-scattering layer 600 may reach the light-blocking layer 610, which may serve as a reflection plate, and may become reflected light L4. The light-scattering layer 600 may secondarily scatter light through the reflected light IA, thereby providing a double effect.

By way of summation and review, a narrow bezel liquid crystal display device in which a width of a non-display area NDA is narrow may have a narrow non-display area NDA compared to a non-narrow bezel liquid crystal display device. In the display device according to the present embodiment, a seal that is hardened by irradiation of light may overlap a wiring group in the non-display area NDA. To avoid a non-hardening of the seal due to a partial blockage of an irradiation of light by the wiring group, a light-scattering layer may be located between the seal and a top substrate to reflect or scatter light onto the seal. A display device with a reduced non-emission area, which displays a high-quality image and simultaneously has improved reliability, and a method of manufacturing the display device may be implemented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:
1. A display device, comprising:
a bottom substrate including a display area and a non-display area around the display area;
a thin film transistor region in the display area, the thin film transistor region including a plurality of thin film transistors and a plurality of pixel electrodes each electrically connected to a respective one of the thin film transistors;
a top substrate facing the bottom substrate with the thin film transistor region therebetween;
a seal in the non-display area to surround the thin film transistor region, the seal being configured to bond the bottom substrate to the top substrate;

a wiring group between the seal and the bottom substrate, the wiring group including a plurality of conductive lines spaced apart from each other by a predetermined interval; and a light-scattering layer between the seal and the top substrate, the light-scattering layer including light-scattering particles.

2. The display device as claimed in claim 1, wherein a diameter of the light-scattering particles is about 2 nm to about 30 nm.

3. The display device as claimed in claim 1, wherein the light-scattering particles include quantum dot particles.

4. The display device as claimed in claim 3, further comprising:

a light-blocking layer under the top substrate, the light blocking layer including a plurality of openings respectively corresponding to the plurality of pixel electrodes;

a filter including a plurality of color filters under the top substrate to cover the plurality of openings;

a planarization layer covering the filter and configured to planarize a top surface of the filter; and a common electrode between the planarization layer and the seal, wherein at least some of the plurality of color filters include the quantum dot particles.

5. The display device as claimed in claim 4, wherein the light-scattering layer includes a same material as one of the plurality of color filters.

6. The display device as claimed in claim 4, wherein the planarization layer extends to the non-display area and is between the seal and the light-scattering layer.

7. The display device as claimed in claim 4, wherein the light-blocking layer extends to the non-display area and is between the top substrate and the light-scattering layer.

8. The display device as claimed in claim 4, wherein the common electrode extends to the non-display area and is between the seal and the planarization layer.

9. The display device as claimed in claim 4, wherein each of the thin film transistors includes a gate electrode and a semiconductor layer which at least partially overlaps the gate electrode.

10. The display device as claimed in claim 1, further comprising a light-blocking layer between the seal and the top substrate.

11. The display device as claimed in claim 10, wherein:
the thin film transistor region further includes a plurality of color filters between the thin film transistor and the plurality of pixel electrodes, and
the plurality of color filters are between the bottom substrate and the plurality of pixel electrodes and each corresponding to a respective one of the plurality of pixel electrodes.

12. The display device as claimed in claim 1, wherein the wiring group includes a wiring to transfer a clock signal to the thin film transistors.

13. The display device as claimed in claim 1, wherein a width of each of the plurality of conductive lines is about 50 μm to about 100 μm.

14. The display device as claimed in claim 13, wherein a spaced width between the plurality of conductive lines is about 15 μm to about 20 μm.

15. The display device as claimed in claim 1, wherein the wiring group overlaps the seal.

* * * * *